United States Patent [19]

Kumar

[11] 4,456,889
[45] Jun. 26, 1984

[54] DUAL-GATE MESFET VARIABLE GAIN CONSTANT OUTPUT POWER AMPLIFIER

[75] Inventor: Mahesh Kumar, South Brunswick, N.J.

[73] Assignee: The United States of America as represented by the Secretary of the Navy, Washington, D.C.

[21] Appl. No.: 270,747

[22] Filed: Jun. 4, 1981

[51] Int. Cl.³ ............................................. H03G 3/30
[52] U.S. Cl. .................... 330/279; 330/133; 330/136; 330/277
[58] Field of Search ............... 330/133, 136, 278, 279, 330/277, 286; 455/116, 235, 253

[56] References Cited

U.S. PATENT DOCUMENTS

| | | | |
|---|---|---|---|
| 3,426,266 | 2/1969 | Day et al. | 307/297 X |
| 3,443,241 | 5/1969 | Pitzalis, Jr. | 330/136 X |
| 3,480,873 | 11/1969 | Carter | 330/277 |
| 3,482,167 | 12/1969 | Kaplan et al. | 330/277 X |
| 3,525,050 | 7/1970 | Walf et al. | 330/277 |
| 3,623,143 | 11/1971 | Marshall | 330/136 X |
| 3,720,880 | 3/1973 | Le Signeur | 330/136 X |
| 4,101,841 | 7/1978 | Okada et al. | 330/279 X |
| 4,223,274 | 9/1980 | Paulke et al. | 330/133 |

FOREIGN PATENT DOCUMENTS 34540 3/1980 Japan ................................. 330/286

OTHER PUBLICATIONS

Fenderson, "The IF Main Amplifier", *The Bell System Technical Journal*, Sep. 1971, pp. 2195-2204.
Kumar et al., "Dual-Gate MESFET Variable-Gain Constant Output Power Amplifier" *IEEE Transactions on Microwave Theory and Techniques*, vol. MTT. 29, No. 3, Mar. 1981, pp. 185-189.

*Primary Examiner*—James B. Mullins
*Attorney, Agent, or Firm*—Robert F. Beers; William T. Ellis; Alan P. Klein

[57] ABSTRACT

A variable-gain, constant output power amplifier which generates an output rf signal of constant power level in response to an input rf signal of varying power level. The amplifier gain is preadjusted by a plurality of feed-forward automatic-gain-control circuits to provide the constant output power. The amplifier comprises five dual-gate MESFET signal-amplifying stages. The first and last stages do not have built-in automatic-gain-control. The first stage is provided for preamplification prior to sampling the input signal, and the last stage is provided for setting the level of the output power externally. The signal at the input of each of the middle three stages is sampled through a coupler and detected and processed at video frequencies to dynamically preadjust the gain of the next signal-amplifying stage.

14 Claims, 5 Drawing Figures

DUAL-GATE MESFET VARIABLE GAIN CONSTANT OUTPUT POWER AMPLIFIER

BACKGROUND OF THE INVENTION

This invention relates to a constant output power amplifier, and more particularly to a constant output power amplifier employing field effect transistors (FET's).

A large number of system applications require an input amplifier with the capacity to handle a large dynamic signal range with variable gain and constant output power with extremely fast response. The conventional limiter is not capable of preserving amplitude modulation and phase coherence on a wide dynamic signal strength range.

SUMMARY OF THE INVENTION

Accordingly, it is an object of the present invention to generate an output signal of constant output power level in response to an input signal of varying power level.

Another object is to generate such signals over a large dynamic signal range with extremely fast response.

A further object is to generate such signals while preserving amplitude modulation and phase coherence on a wide dynamic signal strength range.

These and other objects of the present invention are achieved by a constant output amplifier comprising a plurality of signal-amplifying stages connected in cascade and having adjustable gains. A lesser plurality of gain control means are provided for preadjusting the gains of all but the first and last stages in response to variations in the power level of an input signal applied to the first stage. The action of the gain control means compensates in advance for the variations and maintains constant the power level of the output signal from the last stage. For high input power levels, the signal-amplifying stages do not run into saturation. Thus, the amplifier can retain the amplitude modulation of the input signal. A level control means is provided for adjusting the gain of the last stage to set the value of the constant power level of the output signal.

Additional advantages and features will become apparent as the subject invention becomes better understood by reference to the following detailed description when considered in connection with the accompanying drawings, wherein:

DESCRIPTION OF THE PREFERRED EMBODIMENTS

Figure 1:
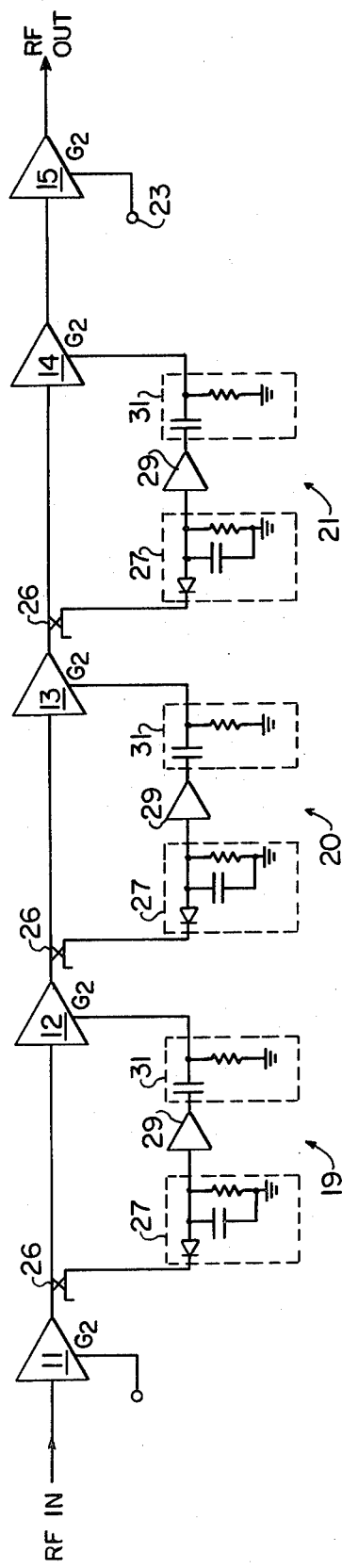
FIG. 1 is a circuit diagram of a constant output power amplifier according to one embodiment of the invention.

Referring to FIG. 1, the constant output power amplifier of the present invention includes five signal amplifying stages 11–15 connected in cascade. Three gain control means 19–21 are employed to preadjust the gains of the second through fourth stages 12–14 in response to variations in the power level of an input signal applied to the first stage 11 so as to compensate in advances for such variations and maintain constant power level of the output signal from the fifth stage 15 in the face of such variations. A level control means 23 is provided to adjust the gain of the fifth stage 15 and set the value of the constant output power level.

Figure 2:
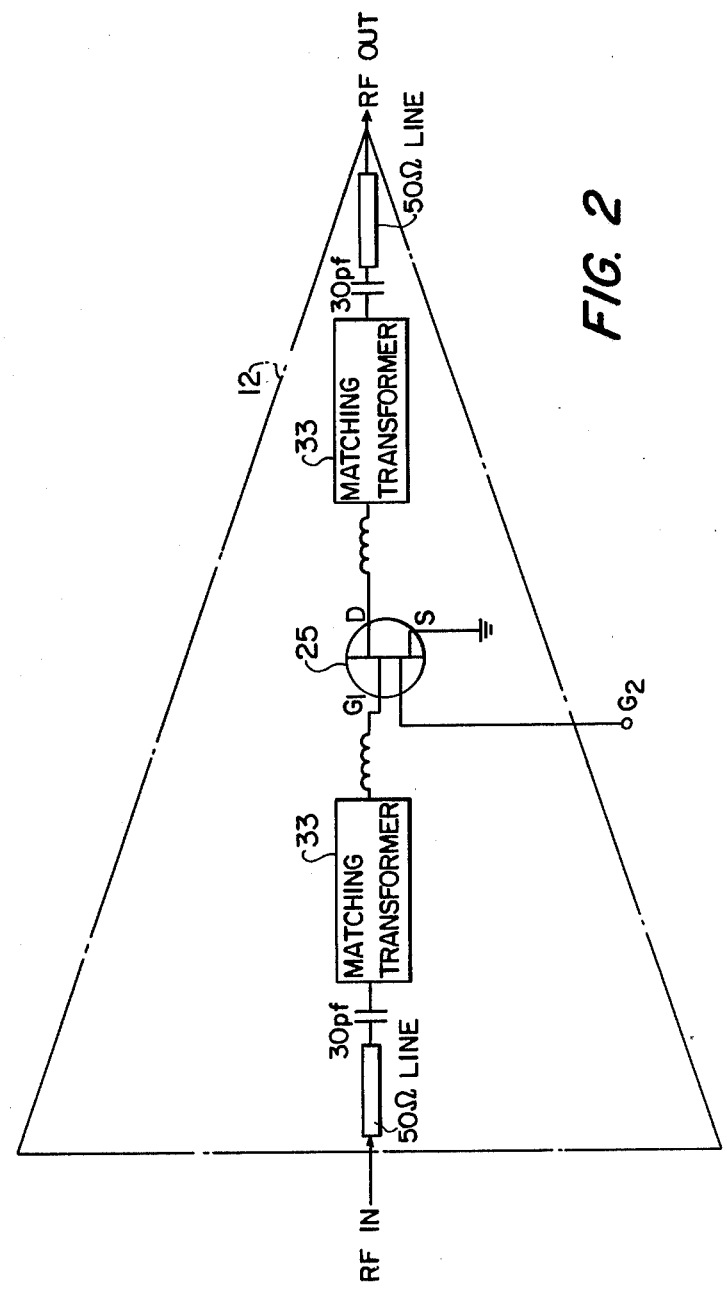
FIG. 2 is a circuit diagram of a signal amplifying stage-shown in FIG. 1.

Each signal-amplifying stage, typically of the form shown in FIG. 2, includes a metal semiconductor field effect transistor (MESFET) 25 having source S, drain D and first and second gate electrodes $G_1$ and $G_2$. The transistor 25 is connected by a signal input circuit and a signal output circuit in a commonsource amplifier configuration. The gain versus second gate electrode characteristic of the transistor 25 is such that the gain of the stage decreases over a range of second gate electrode voltages.

While each of the gain control means 19–21 may take a variety of forms, conveniently it may take the form illustrated in FIG. 1 of a directional coupler 26, such as a 10dB coupler, whose main output port is connected to the transistor first gate electrode $G_1$ of the stage whose gain is to be preadjusted, and whose main input port is connected to the transistor drain electrode D of the preceding stage, a detector 27, such as a diode peak rectifier, connected to the auxiliary output port of the directional coupler, a video amplifier 29 connected to the detector, and a coupling network 31 connected between the detector and the transistor second gate electrode $G_2$ of the stage whose gain is to be preadjusted. The level control means 23 may comprise, for example, a terminal for applying a bias voltage to the transistor second gate electrode $G_2$ of the fifth stage 15.

In operation, a radiofrequency input signal having a time-varying power level is applied to the first stage 11 of the constant output power amplifier and successively amplified in each of the five signal-amplifying stages 11–15. The three directional couplers 26 tap off portions of the amplifier-input-signal replicas appearing at their main input ports and transmit the remainder of the amplified-input-signal replicas to the first gate electrodes of the second through fourth stages 12–14. The three detectors 27 rectify and filter the tapped-off portions to produce error signals whose amplitudes increase in a predetermined polarity in response to increases in the power levels of the amplified-input-signal replicas. The three video amplifiers 29 amplify the error signals to produce gain correction signals therefrom, and the three coupling networks 31 feed the gain correction signals forward to the transistor second gate electrodes $G_2$ of the second through fourth stages 12–14. The gain correction signals bias the transistors 25 in the decreasing gain range of second gate electrode voltages and cause the voltages on the transistor second gate electrodes $G_2$ to vary over the decreasing gain range in response to increases in the power level of the amplified-input-signal replicas. In this manner, increases in the power levels of the amplified-input-signal replicas at the main input ports of the directional couplers 26, which increases are caused by increases in the power level of the radiofrequency input signal applied to the first stage, are compensated in advance by decreases in the gains of the second through fourth stages 12–14, and vice-versa. An appropriate bias voltage applied to the transistor second gate electrode $G_2$ of the fifth stage 15 via terminal 23 adjusts the gain of the fifth stage to set the final (constant) power level of the radiofrequency output signal.

FIG. 2 shows an embodiment of a signal-amplifying stage, e.g., 12, which has provided satisfactory operation. The signal input and signal output circuits include matching transformers 33 for matching the transistor 25 to 50 ohm-line impedance so that the stages 11-15 can be directly cascaded with each other without the use of isolators.

Figure 3:
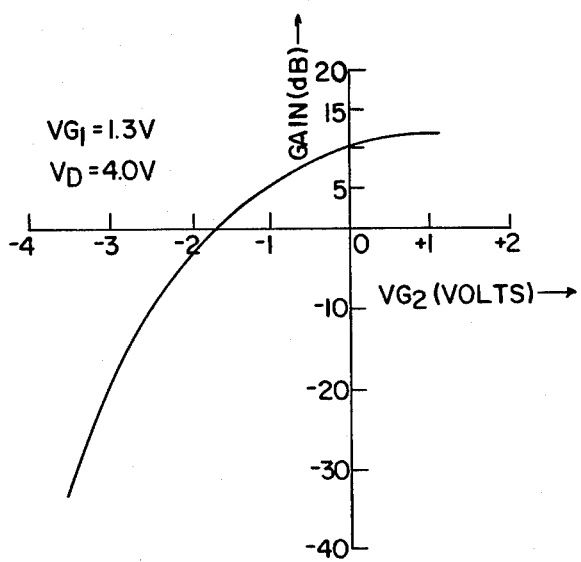
FIGS. 3 and 4 graphically show the relationships between gain and the transistor second gate electrode voltage of the amplifying stage shown in FIG. 2.
Figure 4:
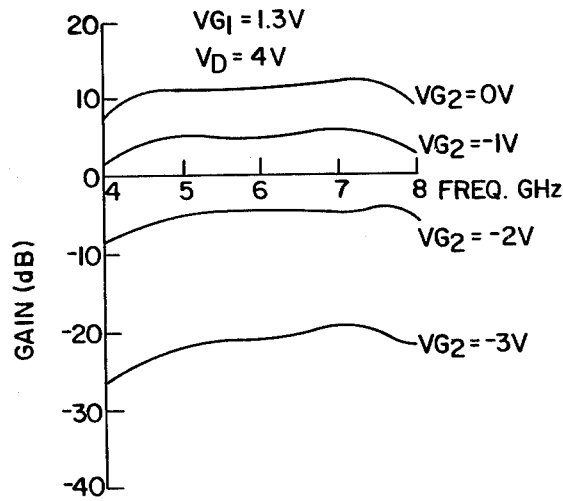

FIGS. 3 and 4 are plots of gain versus second gate electrode voltage $VG_2$ for the stage. The stage has a dynamic range of 10 dB to −30 dB gain for a change in the second gate electrode voltage from 1 V. to −3.5 V. over an octave band. For high input power levels, the stage does not run into saturation.

Figure 5:
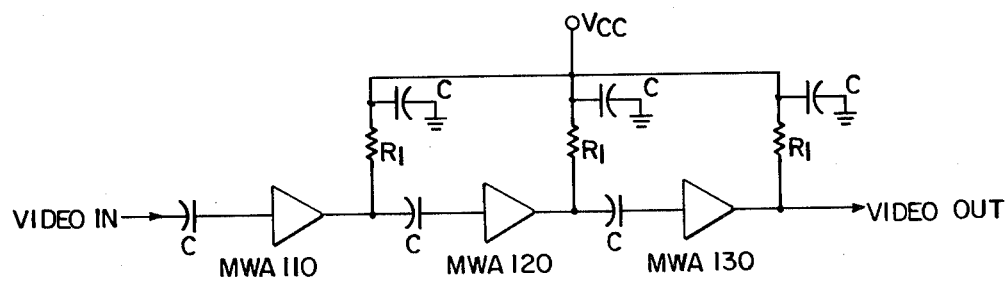
FIG. 5 is a circuit diagram of a video amplifier shown in FIG. 1.

FIG. 5 shows an embodiment of the video amplifier 29 which has provided satisfactory operation. The video amplifier has a gain of 40 dB and a bandwidth greater than 350 MHz. to provide enough control voltage to the second gate electrode $G_2$ of the transistor 25 for dynamically controlling the gain with a response time of 1 ns. The video amplifier is implemented in three stages with Motorola rf hybrid amplifiers MWA 110, MWA 120 and MWA 130 in cascade. The characteristics of each rf hybrid amplifier are given in Table 1.

TABLE 1

CHARACTERISTICS OF rf HYBRID AMPLIFIERS

| rf Hybrid | Frequency Range (MHz) | Gain (dB) | Noise Figure (dB) | Output at 1-dB Compression (dBm) |
|---|---|---|---|---|
| MWA 110 | 0.25–400 | 14 | 4 | −2.5 |
| MWA 120 | 0.25–400 | 14 | 5.5 | +8.2 |
| MWA 130 | 0.25–400 | 14 | 7.0 | +18 |

The characteristics of the three-stage video amplifier are:
Bandwidth: 0.25 to 400 MHz
Gain: 40 dB
Voltage Output (max): 2.5 V An embodiment of the constant output power amplifier has been implemented with the circuits of FIGS. 2 and 5 and tested over the 4-8 GHz. band. The variation of the output power level is within ±2 dB (3±2 dBm) in the 4.5–7.5 GHz range for an input power range of −45 to 0 dBm. The response time of the constant output power amplifier is better than 15 ns. The constant output power amplifier detected simultaneously two pulses of different amplitude separated by 15 nsec. The constant output power amplifier retained a 3 MHz sinusoidal amplitude modulation.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A constant output power amplifier comprising:
   a plurality of signal-amplifying stages connected in cascade and having adjustable gains;
   a lesser plurality of gain control means responsive to variations in the power level of an input signal applied to the first stage for preadjusting the gains of all but the first and last stages to compensate in advance for the variations and maintain constant the power level of the output signal from the last stage; and
   level control means for adjusting the gain of the last stage to set the value of the constant power level, wherein each signal-amplifying stage includes a field effect transistor having a source, drain and first and second gate electrodes.

2. The amplifier recited in claim 1 wherein:
   each signal-amplifying stage has a gain versus second gate electrode characteristic wherein the gain of the stage decreases over a range of second gate electrode voltages.

3. The amplifier recited in claim 2 wherein each gain control means includes:
   a directional coupler having a main output port connected to the transistor first gate electrode of the stage whose gain is to be preadjusted, a main input port connected to the transistor drain electrode of the preceding stage for receiving an amplified-input-signal replica and transmitting the amplified-input-signal replica to the main output port, and an auxiliary output port for tapping off a portion of the amplified-input-signal replica;
   a detector connected to the auxiliary output port of the directional coupler for rectifying and filtering the tapped-off portion to produce an error signal whose amplitude increases in a predetermined polarity in response to increases in the power level of the amplifier-input-signal replica;
   a video amplifier connected to the detector for amplifying the error signal to produce a gain correction signal therefrom; and
   a coupling network connected between the detector and the transistor second gate electrode of the stage whose gain is to be preadjusted for feeding the gain correction signal forward to bias the transistor in the decreasing gain range of second gate electrode voltages and cause the voltage on the transistor second gate electrode to vary over the decreasing gain range in response to increases in the power levels of the amplified-input-signal replica.

4. The amplifier recited in claim 3 wherein the detector includes: a diode peak rectifier.

5. In a constant output power amplifier,
   a signal-amplifying stage;
   gain control means responsive to variations in the power level of an input signal applied to the stage for preadjusting the gain of the stage to compensate in advance for the variations and maintain constant the power level of the output signal from the stage, wherein the signal-amplifying stage includes a field effect transistor having a source, drain and first and second gate electrodes.

6. The combination recited in claim 5 wherein:
   the signal-amplifying stage has a gain versus second gate electrode characteristic wherein the gain of the stage decreases over a range of second gate electrode voltages.

7. The combination recited in claim 6 wherein the gain control means includes:
   a directional coupler having a main input port for receiving the input signal applied to the stage, a main output port connected for transmitting the input signal to the transistor first gate electrode of the stage, and an auxiliary output port for tapping off a portion of the input signal;

a detector connected to the auxiliary output port of the directional coupler for rectifying and filtering the tapped-off portion to produce an error signal whose amplitude increases in a predetermined polarity in response to increases in the power level of the input signal;

a video amplifier connected to the detector for amplifying the error signal to produce a gain correction signal therefrom; and a coupling network connected between the detector and the transistor second gate electrode of the stage for feeding the gain correction signal forward to bias the transistor in the decreasing gain range of second gate electrode voltages and cause the voltage on the transistor second gate electrode to vary over the decreasing gain range in response to increases in the power level of the input signal.

8. The amplifier recited in claim 7 wherein the detector includes:
a diode peak rectifier.

9. The combination recited in claim 6 wherein the gain control means includes:
a directional coupler having a main input port for receiving the input signal applied to the stage, a main output port connected for transmitting the input signal to the transistor first gate electrode of the stage, and an auxiliary output port for tapping off a portion of the input signal.

10. The combination recited in claim 9 wherein the gain control means includes:
a detector connected to the auxiliary output port of the directional coupler for rectifying and filtering the tapped-off portion to produce an error signal whose amplitude increases in a predetermined polarity in response to increases in the power level of the input signal.

11. The combination recited in claim 10 wherein the gain control means includes:
a video amplifier connected to the detector for amplifying the error signal to produce a gain correction signal therefrom.

12. A constant output power amplifier comprising:
a plurality of signal-amplifying stages connected in cascade and having adjustable gains, each signal-amplifying stage including a field effect transistor having a source, drain and first and second gate electrodes, each signal-amplifying stage having a gain versus second gate electrode characteristic wherein the gain of the stage decreases over a range of second gate electrode voltages;

a lesser plurality of gain control means responsive to variations in the power level of an input signal applied to the first stage for preadjusting the gains of all but the first and last stages to compensate in advance for the variations and maintain constant the power level of the output signal from the last stage; and level control means for adjusting the gain of the last stage to set the value of the constant power level, wherein each gain control means includes a directional coupler having a main output port connected to the transistor first gate electrode of the stage whose gain is to be preadjusted, a main input port connected to the transistor drain electrode of the preceding stage for receiving an amplified-input-signal replica and transmitting the amplified-input-signal replica to the main output port, and an auxiliary output port for tapping off a portion of the amplified-input-signal replica.

13. The amplifier recited in claim 12 wherein each gain control means includes:
a detector connected to the auxiliary output port of the directional coupler for rectifying and filtering the tapped-off portion to produce an error signal whose amplitude increases in a predetermined polarity in response to increases in the power level of the amplified-input-signal replica.

14. The amplifier recited in claim 13 wherein each gain control means includes:
a video amplifier connected to the detector for amplifying the error signal to produce a gain correction signal therefrom.

* * * * *